(12) United States Patent
Capodivacca et al.

(10) Patent No.: US 6,255,904 B1
(45) Date of Patent: Jul. 3, 2001

(54) ANTI-POP CIRCUIT FOR AC AMPLIFIERS

(75) Inventors: Giovanni Capodivacca, Gorla Maggiore; Davide Brambilla, Rho, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/461,163

(22) Filed: Dec. 14, 1999

(30) Foreign Application Priority Data

Dec. 16, 1998 (IT) .............................................. VA98A0027

(51) Int. Cl.⁷ ................................ H03F 1/14; H03F 21/00
(52) U.S. Cl. .......................... 330/51; 330/149; 381/94.1; 381/120; 381/94.5; 381/94.8
(58) Field of Search .................... 330/51, 149; 381/94.1, 381/120, 94.5, 94.8, 261

(56) References Cited

U.S. PATENT DOCUMENTS

| | | | |
|---|---|---|---|
| 5,317,280 | * | 5/1994 | Zimmer et al. ........................ 330/261 |
| 5,642,074 | * | 6/1997 | Ghaffaripour et al. ................. 330/51 |
| 5,642,076 | * | 6/1997 | Naokawa .............................. 330/149 |
| 5,796,303 | * | 8/1998 | Vinn et al. ............................. 330/51 |
| 5,982,234 | * | 11/1999 | Compagne ........................... 330/149 |

* cited by examiner

*Primary Examiner*—Michael B Shingleton
(74) *Attorney, Agent, or Firm*—Theodore E. Galanthay; Allen, Dyer, Doppelt, Milbrath & Gilchrist, P.A.

(57) ABSTRACT

The anti-pop circuit includes a unity gain buffer with an input coupled to the source of the reference voltage and an output coupled to the input of the amplifier to accelerate the charging of the input coupling capacitor of the amplifier at every turn-on. The capacitor-charging buffer is automatically disabled before the turning-on of the amplifier. The charging buffer may be enabled at start up by generating an impulse of a pre-established duration at the turn-on instant by a monostable circuit or by disabling it upon verifying the decaying to zero of the charging of current of the input coupling capacitor. The circuit eliminates the popping noise at the turn-on without an excessive delay of the turning-on of the amplifier.

25 Claims, 2 Drawing Sheets

ANTI-POP CIRCUIT FOR AC AMPLIFIERS

FIELD OF THE INVENTION

The present invention relates to low frequency AC amplifiers, and more particularly, to single-ended audio amplifiers biased at a fixed reference voltage.

BACKGROUND OF THE INVENTION

When single-ended audio amplifiers biased at a fixed reference voltage are turned on, the coupling capacitor of the AC signal at the input of the amplifier is uncharged and at the turn-on instant the charge transient of the input capacitance may cause an undesired typical noise (pop). This disturbance occurs when the final stage of the amplifier is turned on while the charging of the input capacitance is still insufficient.

The phenomenon is highlighted in FIGS. 1A and 1B, in which the functional scheme of a single-ended amplifier and the relative diagrams of the turn-on transient are depicted. If at the instant To the source of the reference voltage Vref is turned on, because of the still incomplete state of charge of the input capacitance Cin, the input voltage Vin (that is, the voltage on the noninverting input (+) of the xA amplifier) will not be equal to the reference voltage Vref applied on the inverting input (−) of the amplifier. If the output power stage of the amplifier is turned on, for example, at the instant T1 (which may coincide with the turn-on instant To), the signal output is equal to Vout=A×Vref exp(−t/(Rin*Cin)) and causes a typical popping noise.

The level of this popping noise is commonly reduced by delaying the turn-on of the final stage of the amplifier in respect to the turn-on instant of the source of the reference voltage Vref. However, this approach cannot completely overcome the problem unless the delay is very long. Another known technique includes doubling the input stages, in order to "mute" the amplifier during the turn-on transient, however more complex circuits are needed and an appropriate time constant is programmable through a dedicated pin of the device to retard the switching from a mute to a play condition.

SUMMARY OF THE INVENTION

An object of the present invention is to provide an anti-pop circuit that overcomes the above noted drawbacks of the known techniques. The circuit of the invention uses a simple approach and entails markedly shorter time constants than those that are commonly required according to the known techniques.

The anti-pop circuit of the invention includes a unity gain buffer with an input coupled to the source of the reference voltage Vref and an output coupled to the input of the amplifier to accelerate the charging of the input coupling capacitor of the amplifier at every turn-on. The capacitor-charging buffer is automatically disabled before the turning-on of the amplifier, i.e. the turning on of the output power stage of the amplifier. The charging buffer may be enabled at start up by generating an impulse of a pre-established duration at the turn-on instant by a monostable circuit or by disabling it upon verifying the decaying to zero of the charging of current of the input coupling capacitor.

The device of the invention eliminates the popping noise at the turn-on without an excessive delay of the turning-on of the amplifier.

BRIEF DESCRIPTION OF THE DRAWINGS

The various aspects and advantages of the system of the invention will become even clearer through the following description of an embodiment and by referring to the attached drawings, wherein.

DETAILED DESCRIPTION OF THE PREFERRED EMBODIMENTS

Figures 1A, 1B:
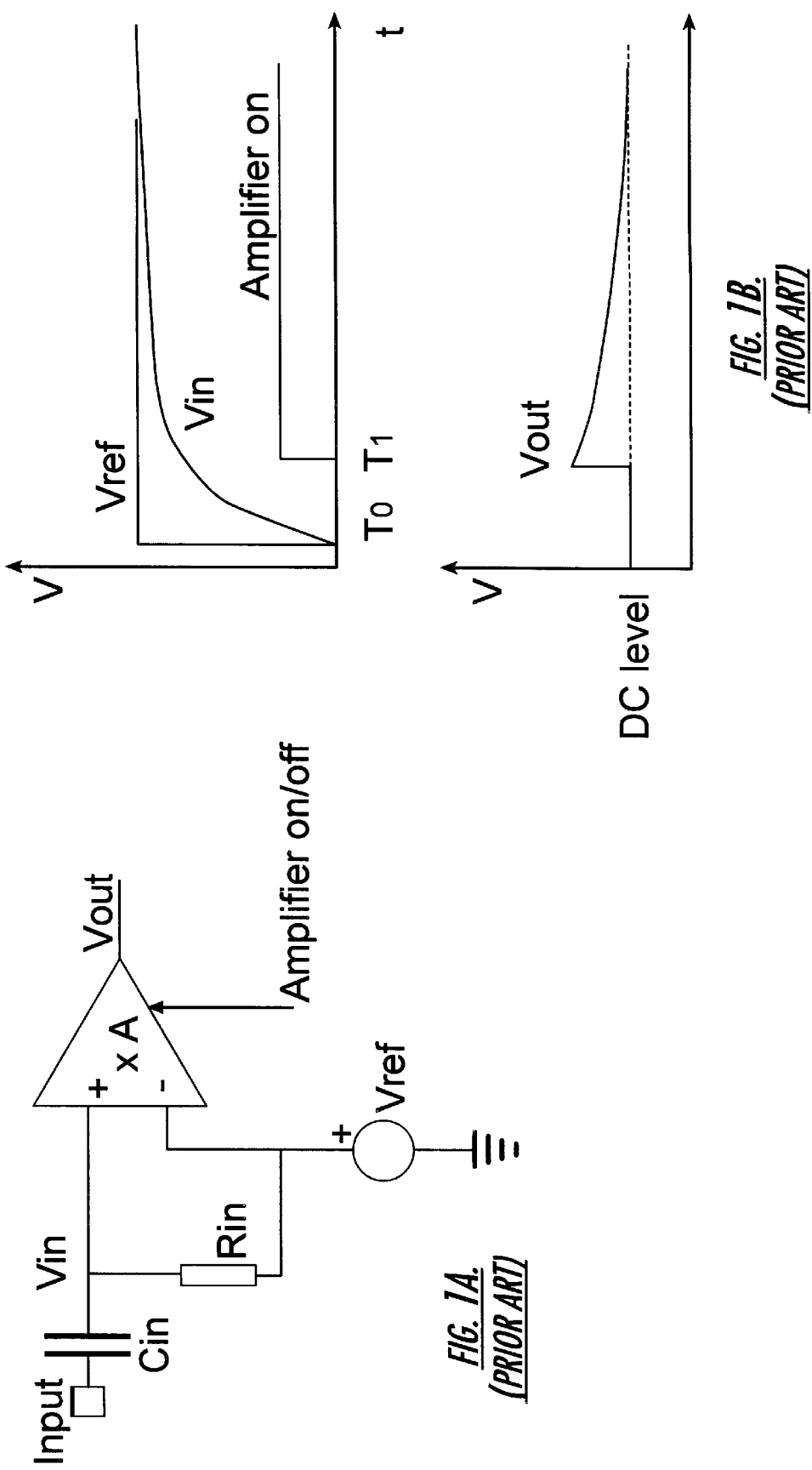
FIGS. 1A–1B illustrate the problem of a typical audio amplifier.
Figures 2A, 2B:
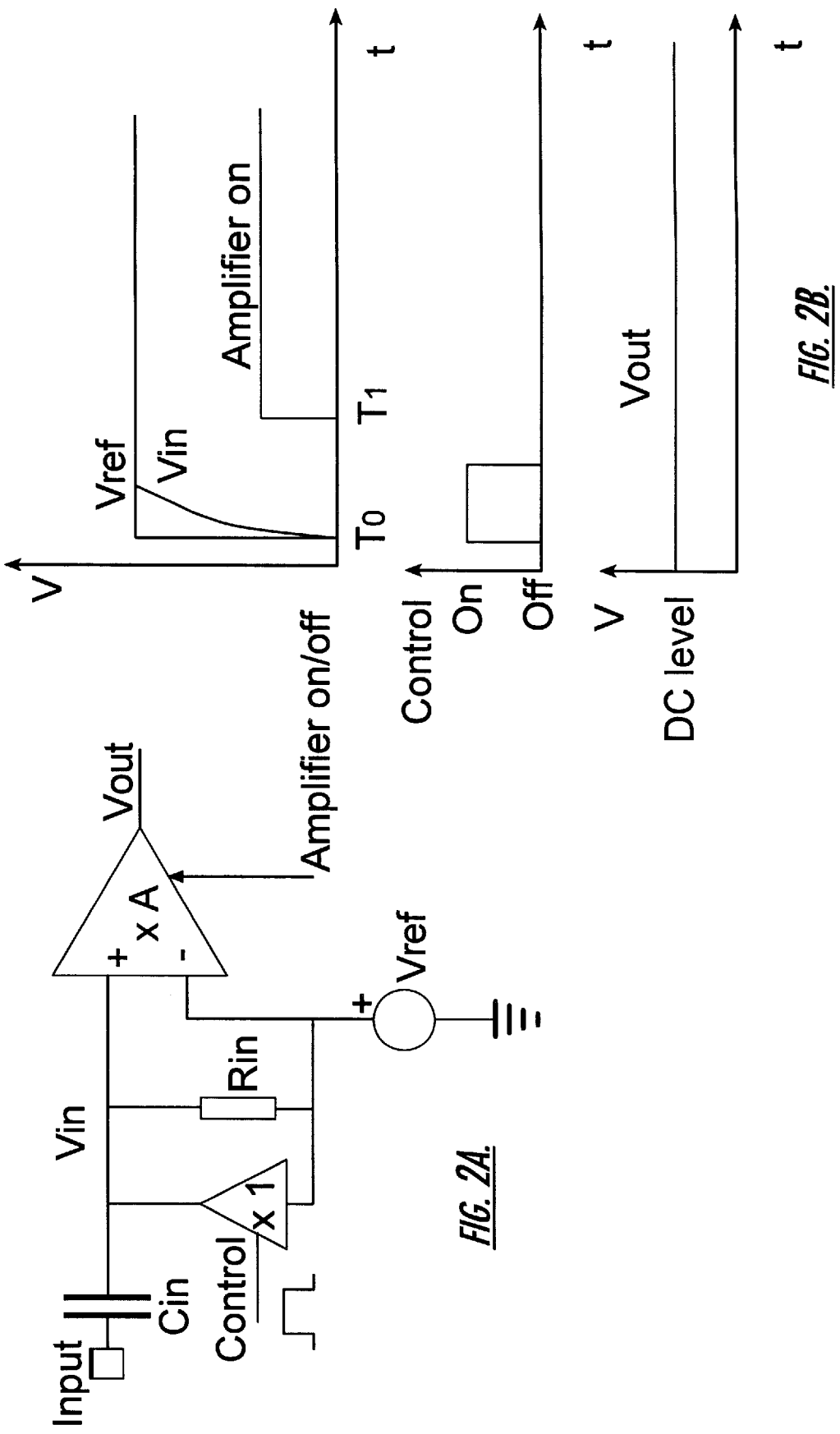
FIGS. 2A–2B illustrate the circuit of the invention and the relative diagrams of the turn-on transient.

With reference to FIGS. 2A and 2B, starting from the turn-on instant To, the input coupling capacitor Cin is charged, up to the reference voltage Vref by the unity gain buffer x1 for a time interval established by the disabling command CONTROL. The buffer x1 is disabled to avoid any effect on the normal functioning of the amplifier xA. The effect of the buffer x1 is highlighted in the relative diagrams (FIG. 2B) of the turn-on transient where it may be observed how the voltage on the input node Vin of the amplifier xA rapidly reaches the reference value Vref by virtue of the quick charging of the input coupling capacitance Cin by the buffer x1.

The time of enablement of the charging buffer x1 may be easily established to ensure a complete charging of the input capacitance Cin to Vref. The delayed turn-on, at the instant T1, of the output power stage of. the amplifier xA occurs simultaneously or after the disabling of the charging buffer x1 and, as highlighted in the diagram of the output voltage, any pop phenomenon is eliminated.

The CONTROL command, enabling/disabling the charging buffer x1 of the input capacitance may be generated by a monostable circuit, referred to as one-shot timer, or by a dedicated circuit monitoring the decay to zero of the charging current of the input capacitor Cin when it reaches the Vref voltage. That is:

$$Vin = Vref\ for\ IC = 0$$

Preferably, the buffer x1 used to speed-up the charging of the input coupling capacitor Cin at turn-on should have a low offset because its offset will be replicated at the output of the amplifier xA multiplied by the gain of the amplifier.

That which is claimed is:

1. An anti-pop circuit for a single-ended AC amplifier having an output power stage, the circuit comprising:

a reference voltage source for biasing a first input of the amplifier at a reference voltage;

an output power stage activator including a capacitor connected to a second input of the amplifier, for turning on the output power stage of the amplifier after a predetermined delay from a turn-on instant of the reference voltage source; and a unity gain buffer having an input connected to the reference voltage source and an output connected to the second input of the amplifier, the unity gain buffer being activated at the turn-on instant of the reference voltage source for a time interval less than or equal to the predetermined delay.

2. An anti-pop circuit according to claim 1, wherein the unity gain buffer is activated by a pulse of a predetermined duration at the turn-on instant.

3. An anti-pop circuit according to claim 1, wherein the unity gain buffer is de-activated when a charging current of the capacitor decays to zero.

4. A circuit for reducing noise in an amplifier, the circuit comprising:

a reference voltage source for biasing a second input of the amplifier at a reference voltage;

a delay circuit for delaying the turning on of the amplifier for a predetermined delay time from a turn-on instant of the reference voltage source; and a gain buffer having an input connected to the reference voltage source and an output connected to a second input of the amplifier.

5. A circuit according to claim 4, wherein the gain buffer is activated at the turn-on instant of the reference voltage source for a time interval less than or equal to the predetermined delay time.

6. A circuit according to claim 4, wherein the gain buffer is activated by a pulse of a predetermined duration at the turn-on instant.

7. A circuit according to claim 4, wherein the delay circuit comprises a capacitor connected to the second input of the amplifier, and wherein the gain buffer is de-activated when a charging current of the capacitor decays to zero.

8. A circuit according to claim 7, wherein the delay circuit further comprises a resistor connected between the reference voltage source and the capacitor.

9. A circuit according to claim 4, wherein the amplifier comprises a single-ended AC amplifier having an output power stage, and wherein the delay circuit delays the turning on of the output power stage of the amplifier for the predetermined delay time.

10. An amplifier circuit comprising:

an amplifier;

a reference voltage source for biasing a first input of the amplifier at a reference voltage;

a delay circuit for delaying the turning on of the amplifier for a predetermined delay time from a turn-on instant of the reference voltage source;

a gain buffer having an input connected to the reference voltage source and an output connected to a second input of the amplifier; and a control device for activating the gain buffer at the turn-on instant of the reference voltage source for a time interval less than or equal to the predetermined delay time.

11. An amplifier circuit according to claim 10, wherein the control device comprises a monostable circuit for activating the gain buffer by a pulse of a predetermined duration at the turn-on instant.

12. An amplifier circuit according to claim 10, wherein the delay circuit comprises a capacitor connected to the second input of the amplifier, and wherein the control device comprises a monitoring circuit for de-activating the gain buffer when a charging current of the capacitor decays to zero.

13. An amplifier circuit according to claim 12, wherein the delay circuit further comprises a resistor connected between the reference voltage source and the capacitor.

14. An amplifier circuit according to claim 10, wherein the amplifier comprises a single-ended AC amplifier having an output power stage, and wherein the delay circuit delays the turning on of the output power stage of the amplifier for the predetermined delay time.

15. A method for reducing noise in an amplifier comprising the steps of:

biasing a first input of the amplifier at a reference voltage;

delaying the turning on of the amplifier for a predetermined delay time from a turn-on instant of the reference voltage;

providing a gain buffer having an input connected to the reference voltage and an output connected to a second input of the amplifier;

activating the gain buffer at the turn-on instant of the reference voltage source for a time interval less than or equal to the predetermined delay time.

16. A method according to claim 15, wherein the step of activating the gain buffer comprises providing a pulse of a predetermined duration at the turn-on instant.

17. A method according to claim 15, wherein the step of delaying the turning on of the amplifier comprises providing a capacitor connected to the second input of the amplifier, and further comprising the step of de-activating the gain buffer when a charging current of the capacitor decays to zero.

18. A method according to claim 17, wherein the step of delaying the turning on of the amplifier further comprises providing a resistor connected between the reference voltage and the capacitor.

19. A method according to claim 15, wherein the amplifier comprises a single-ended AC amplifier having an output power stage, and wherein the step of delaying the turning on of the amplifier comprises delaying the turning on of the output power stage of the amplifier for the predetermined delay time.

20. A method of making a circuit for reducing noise in an amplifier, the method comprising the steps of:

providing a reference voltage source for biasing a first input of the amplifier at a reference voltage;

providing a delay circuit for delaying the turning on of the amplifier for a predetermined delay time from a turn-on instant of the reference voltage source;

connecting an input of a gain buffer to the reference voltage source and an output of the gain buffer to a second input of the amplifier.

21. A method according to claim 20, further comprising the step of providing a control device for activating the gain buffer at the turn-on instant of the reference voltage source for a time interval less than or equal to the predetermined delay time.

22. A method according to claim 21, wherein the control device comprises a monostable circuit for activating the gain buffer by a pulse of a predetermined duration at the turn-on instant.

23. A method according to claim 21, wherein the delay circuit comprises a capacitor connected to the second input of the amplifier, and wherein the control device comprises a monitoring circuit for de-activating the gain buffer when a charging current of the capacitor decays to zero.

24. A method according to claim 23, wherein the delay circuit further comprises a resistor connected between the reference voltage source and the capacitor.

25. A method according to claim 20, wherein the amplifier comprises a single-ended AC amplifier having an output power stage, and wherein the delay circuit delays the turning on of the output power stage of the amplifier for the predetermined delay time.

* * * * *